United States Patent
Pan et al.

(10) Patent No.: US 7,524,732 B2
(45) Date of Patent: Apr. 28, 2009

(54) SEMICONDUCTOR DEVICE WITH L-SHAPED SPACER AND METHOD OF MANUFACTURING THE SAME

(75) Inventors: Chung-We Pan, Pingtung County (TW); Shi-Cheng Lin, Kaohsiung County (TW); Ching-Hung Fu, Hsin-Chu (TW); Chih-Ping Chung, Hsin-Chu (TW)

(73) Assignee: Promos Technologies Inc., Hsinchu (TW)

( * ) Notice: Subject to any disclaimer, the term of this patent is extended or adjusted under 35 U.S.C. 154(b) by 149 days.

(21) Appl. No.: 11/465,881

(22) Filed: Aug. 21, 2006

(65) Prior Publication Data
US 2007/0272962 A1    Nov. 29, 2007

(30) Foreign Application Priority Data
May 25, 2006    (TW) ............................... 95118551 A (51) Int. Cl.
*H01L 21/20* (2006.01)
(52) U.S. Cl. .................. 438/397; 438/424; 438/425; 438/426; 438/427
(58) Field of Classification Search .............. 438/391, 438/397
See application file for complete search history.

(56) References Cited

U.S. PATENT DOCUMENTS 6,022,786 A * 2/2000 Franosch et al. ............ 438/398
2005/0006795 A1  1/2005 Yih et al.

* cited by examiner

Primary Examiner—Ha Tran T Nguyen
Assistant Examiner—Chakila Tillie
(74) *Attorney, Agent, or Firm*—Grossman Tucker Perreault & Pfleger PLLC (57) ABSTRACT

A semiconductor device with an L-shape spacer and the method for manufacturing the same are provided. The semiconductor device comprises a substrate, a composite spacer, and a tunnel insulating layer. The substrate comprises a shallow trench isolation structure and a neighboring active area. The composite spacer is formed on the sidewall of the shallow trench isolation structure, and further comprises a first insulating layer and an L-shape second insulating layer spacer, wherein the first insulating layer is located between the L-shape second insulating layer spacer and the substrate. The tunnel insulating layer is located on the substrate of the active area and connects to the first insulating layer of the composite spacer on its corresponding side.

18 Claims, 7 Drawing Sheets

SEMICONDUCTOR DEVICE WITH L-SHAPED SPACER AND METHOD OF MANUFACTURING THE SAME

This application claims priority to Taiwan Patent Application No. 095118551 filed on May 25, 2006.

CROSS-REFERENCES TO RELATED APPLICATIONS

Not applicable.

BACKGROUND OF THE INVENTION

1. Field of the Invention

The subject invention relates to a semiconductor device and its manufacturing method, especially to a semiconductor device with an L-shape spacer and its manufacturing method.

2. Descriptions of the Related Art

In recent years, high integration flash memories have been used in many industries. One reason is that the reduction of memory cell size significantly decreased the production cost. Conventional shallow trench isolation ("STI") technologies have often been utilized in the production of flash memories because of the minimized size of the memory cells manufactured thereby and the high integration of the flash memories.

However, a corner thinning effect often occurs in the tunnel insulating layer of the device area of flash memory, lowering the coupling ratio thereby. A lower coupling ratio requires a higher gate voltage to erase the content of the memory, locally generating a high electric field at the edge of the device area and causing serious reliability problems in the devices. Problems include hot-carrier traps, damage to the oxide layers, reduction of write/erase tolerance, read interference, and a decrease of data retention, and thus inhibit the size reduction of flash memory. Moreover, flash memory with a lower coupling ratio generates the Fowler-Nordheim tunneling ("F-N" tunneling) effect at a higher electric field. That is, the electron transporting rate between the floating gate and the source/drain becomes slower, thereby, decreasing the rate of the read/write property. Consequently, when manufacturing semiconductors, it is important to produce a flash memory that has a high coupling ratio without the detriment of the corner thinning effect in the tunnel insulating layer.

Figure 1:
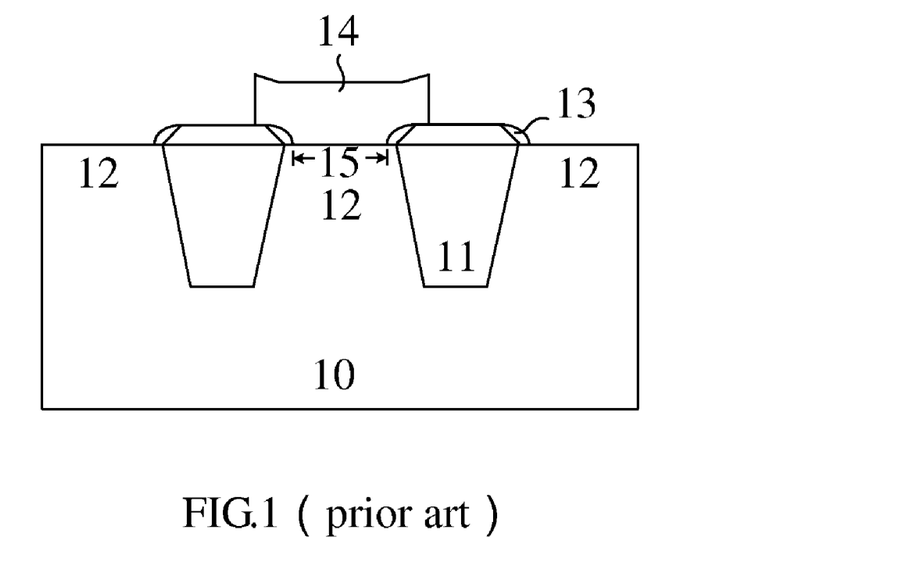
FIG. 1 shows a cross-section view of a spacer structure for reducing the corner thinning effect of the tunnel insulating layer in the prior art.

Regarding the corner thinning effect of the tunnel insulating layer in the device area, a spacer in the device area of the flash memory device has been proposed. Referring to FIG. 1, the shallow trench isolation structure 11 and the active area 12 are formed onto the substrate 10. To reduce the corner thinning effect, a spacer 13 is formed from the insulating layer on the edge of the active area 12 and at the side of the shallow trench isolation structure 11.

However, the use of the spacer 13 fails to effectively control the coupling ratio. Still referring to FIG. 1, the spacer 13 will reduce the area of the tunnel 15 under the floating gate 14, thus, reducing the channel current between the floating gate 14 and the substrate 10 and slowing down the read/write speed.

Given the above limitations, the semiconductor industry consistently seeks to increase the integration of flash memories without increasing manufacturing costs and avoiding a low coupling ratio to enhance the speed and reliability of the read/write property. Therefore, the subject invention provides a solution that particularly addresses the above problems.

SUMMARY OF THE INVENTION

One object of the subject invention is to provide a method for manufacturing a semiconductor device with an L-shape spacer so as to provide a flash memory with high integration and a high coupling ratio. The method comprises the following steps: forming a shallow trench isolation structure and an active area on a substrate, wherein the active area is covered by a first insulating layer; and depositing a second insulating layer to cover both the first insulating layer and the shallow trench isolation structure. Thereafter, a third insulating layer is deposited on the second insulating layer, followed by removing a portion from both the second insulating layer and third insulating layer to form an L-shape second insulating spacer and a third insulating spacer. Afterwards, the third insulating spacer is removed, leaving the L-shape second insulating layer spacer on the first insulating layer.

Another object of the subject invention is to provide a semiconductor device with an L-shape spacer to resolve the reliability problems resulting from both the flash memory's low coupling ratio and the slowing down of the read/write speed as a result of a low channel current. The semiconductor device comprises a substrate, a composite spacer, and a tunnel insulating layer. The substrate comprises a shallow trench isolation structure and a neighboring active area. The composite spacer is located on a sidewall of the shallow trench isolation structure and comprises a first insulating spacer and an L-shape second insulating spacer. The first insulating spacer is located between the L-shape second insulating spacer and the substrate. The tunnel insulating layer is located on the substrate of the active area and connects to the first insulating spacer on its corresponding side.

DESCRIPTION OF THE PREFERRED EMBODIMENT

Figure 2:
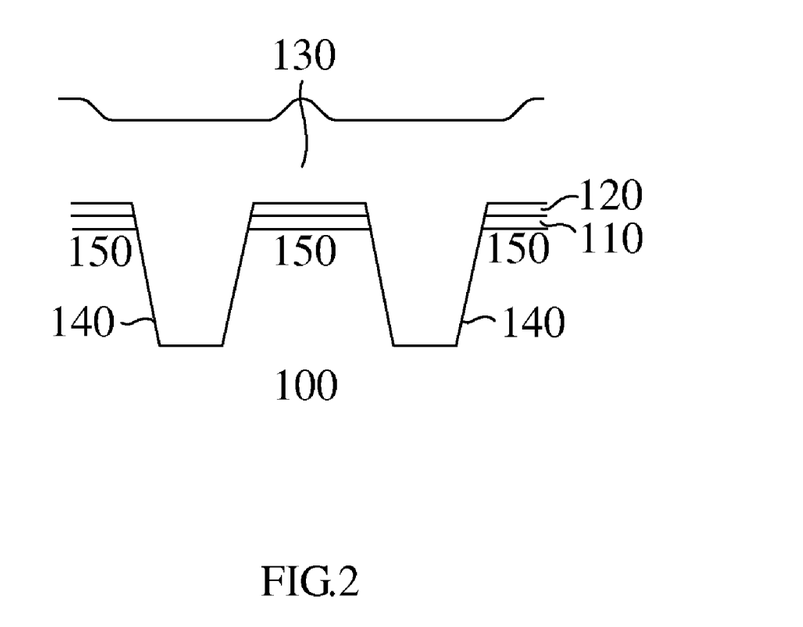
FIGS. 2 to 8 show cross-sectional views of one embodiment method of the present invention for manufacturing a semiconductor device with an L-shape spacer according to the subject invention.
Figure 3:
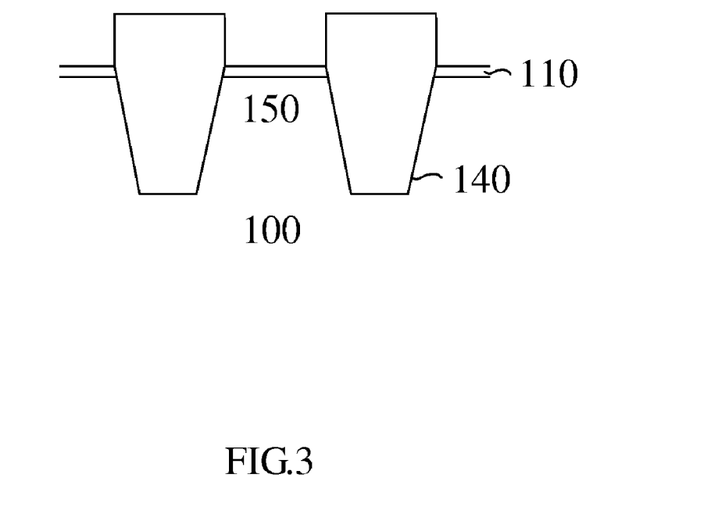

One embodiment of the manufacturing method is provided below to illustrate how the subject invention resolves the problems and drawbacks encountered in the prior technologies. FIG. 2 shows that a first insulating layer 110 and an insulating layer 120 are separately formed onto a silicon substrate 100 of a semiconductor. Preferably, the first insulating layer 110 is a silicon dioxide layer formed by thermal oxidation and has a thickness ranging from about 10 Å to about 1000 Å. The insulating layer 120 is preferably a silicon nitride layer formed by a deposition process, with a thickness ranging from about 500 Å to about 2000 Å. Afterwards, a predetermined shallow trench isolation area and a predetermined active area are defined by performing an anisotropic or isotropic etching process with an appropriate photoresist (not depicted). Another insulating layer 130 is then deposited to cover the predetermined shallow trench isolation area and the predetermined active area located on the substrate 100. In one preferred embodiment of the subject invention, a high density plasma oxide layer as the insulating layer 130 is deposited using a high density plasma process to cover the substrate 100. Thereafter, the insulating layer 120 and portions of the high density plasma oxide layer on the regions other than the shallow trench isolation area are removed by a chemical mechanical polishing ("CMP") process and an anisotropic etching process. As shown in FIG. 3, a shallow trench isolation structure 140 and an active area 150 are finally formed on the substrate 100, with the first insulating layer 110 located on the active area 150.

Figure 4:
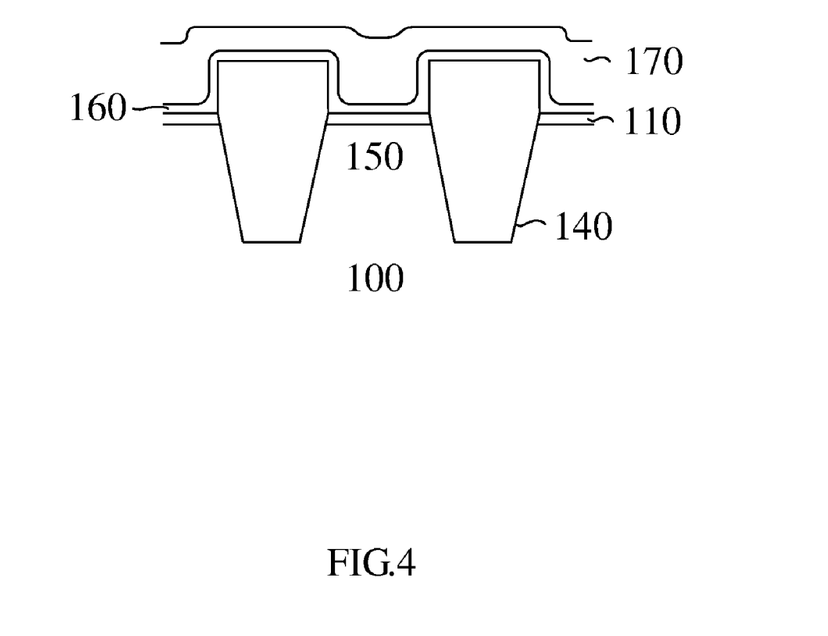
Figure 5:
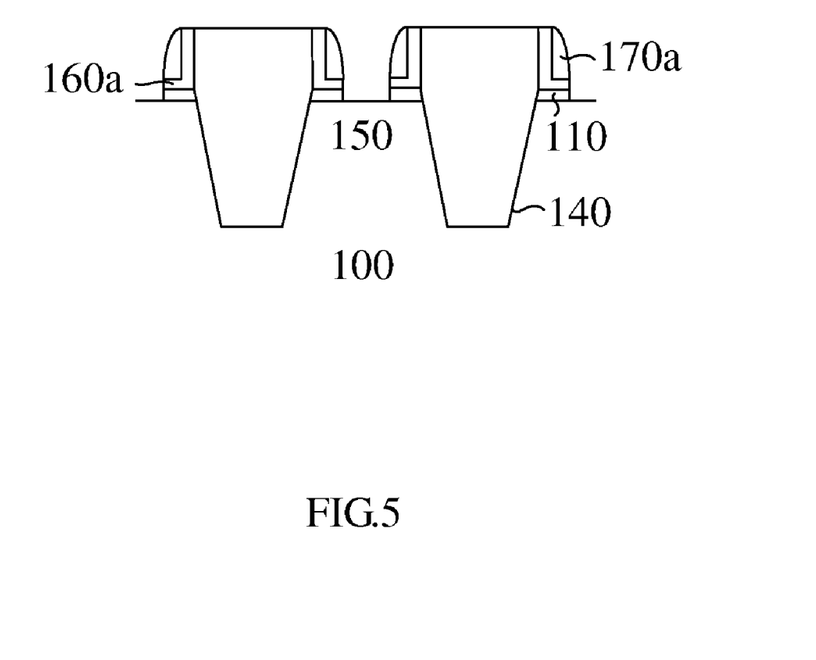

Referring to FIG. 4, a second insulating layer 160 is deposited to cover the first insulating layer 110 and the shallow trench isolation structure 140. Then, a third insulating layer 170 is deposited on the second insulating layer 160. Preferably, the second insulating layer 160 is a silicon nitride layer formed by a deposition process, with a thickness ranging from about 10 Å to about 500 Å. The third insulating layer 170 is a silicon dioxide layer. Afterwards, as shown in FIG. 5, a portion from both the third insulating layer 170 and second insulating layer 160 is removed by etching back to form a third insulating spacer 170a and an L-shape second insulating spacer 160a. Preferably, the etching back step comprises the removal of a portion from the third insulating layer 170 by an anisotropic dry etching process so as to form the third insulating spacer 170a, followed by the removal of a portion from the second insulating layer 160 with an isotropic or anisotropic etching process to form the second insulating spacer 160a above the first insulating layer 110. The etching back step may etch through the first insulating layer 110 and also removes a portion from layer 110 as shown in FIG. 5.

Figure 6:
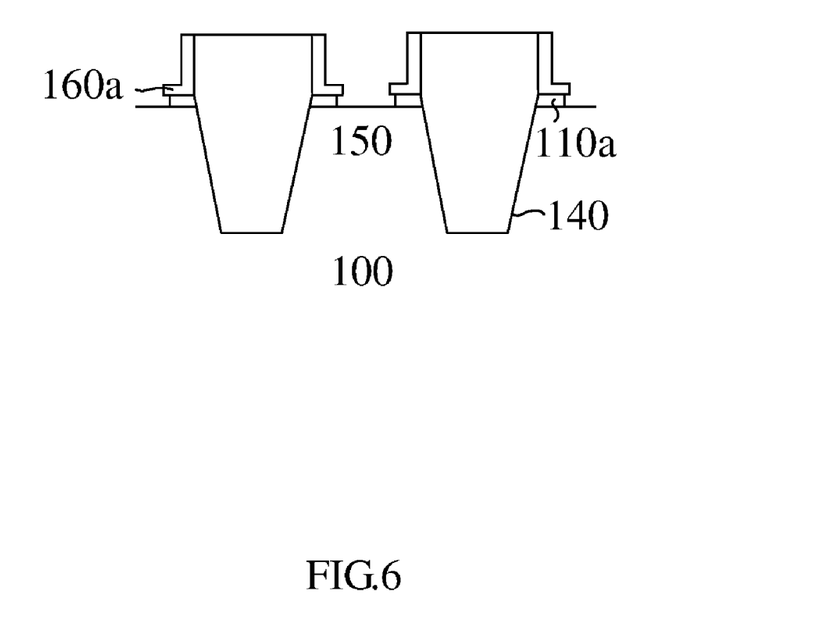

Following FIG. 5, FIG. 6 shows the removal of the third insulating spacer 170a of the two-layer spacer by an isotropic wet etching process. In this wet etching process, the time for removing the third insulating spacer 170a and a portion of the first insulating layer 110 above the substrate 100 should be controlled to leave a portion of the first insulating layer 110 and form a first insulating spacer 110a under the L-shape second insulating spacer 160a. The first insulating spacer 110a and the L-shape second insulating spacer 160a located thereon are combined as a composite spacer.

Figure 7:
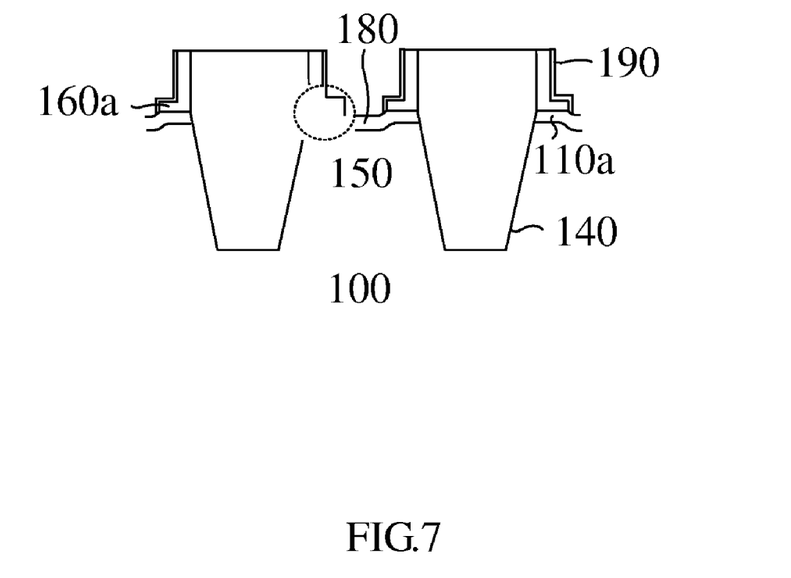
Figure 8:
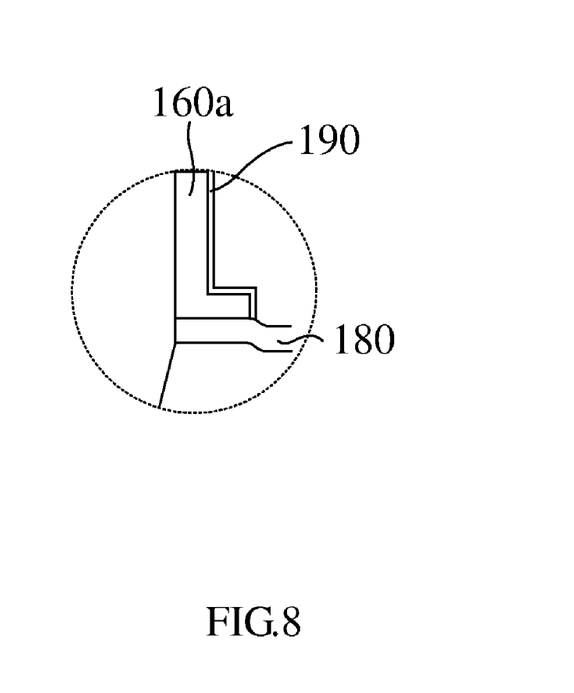

Referring to FIG. 7, a tunnel insulating layer 180 is formed on the substrate 100. In one preferred embodiment, the tunnel insulating layer 180 is identical in material to the first insulating spacer 110a. In other words, the first insulating spacer 110a described in the above-mentioned embodiment is made of a silicon dioxide layer formed by a thermal oxidation process; thus, thermal oxidation is also conducted to form a silicon dioxide layer as the tunnel insulating layer 180. In addition, both sides of the tunnel insulating layer 180 connect to the corresponding first insulating layer spacers 110a. The presence of the first insulating spacer 110a effectively prevents the thinning effect of the tunnel layer that occurred in the prior art. In addition, as shown in the partially enlarged view of FIG. 7 provided in FIG. 8, a silicon dioxide layer 190 is generally formed on the L-shape second insulating layer spacer 160a as the formation of the tunnel insulating layer.

Figure 9:
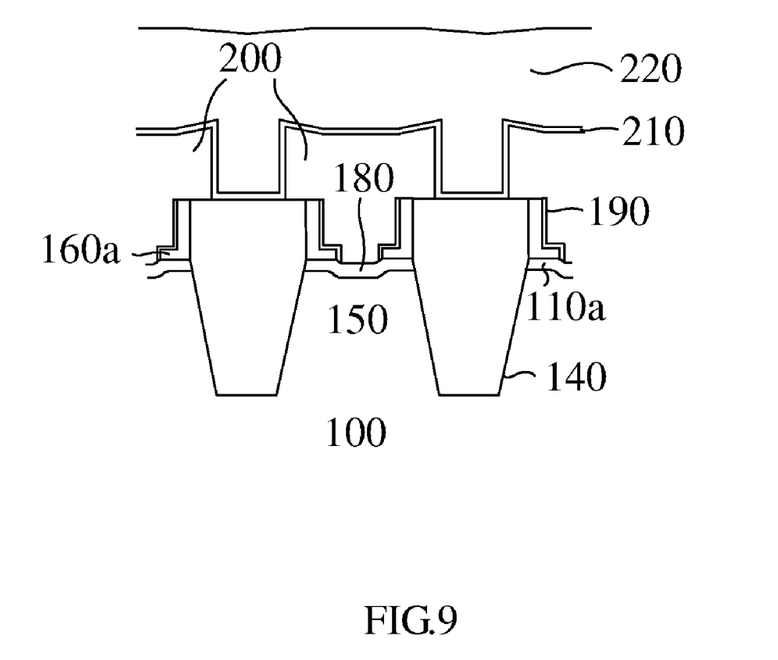
FIG. 9 shows an embodiment of the steps subsequent to those depicted in FIG. 8, the embodiment comprises both the formation of a floating gate with a patterned mask layer and the formation of a dielectric layer and a control gate.

Referring to FIG. 9, after the formation of the tunnel insulating layer 180, a first polysilicon layer is deposited and then patterned with a mask layer (not depicted) to form a floating gate 200. Thereafter, a dielectric layer 210 is formed on the floating gate 200, wherein the material of the dielectric layer 210 can be silicon dioxide, silicon nitride, a material with a high dielectric constant, or a combination thereof. Preferably, the dielectric layer 210 has a sandwich structure, such as silicon dioxide-silicon nitride-silicon dioxide (Oxide-Nitride-Oxide, "ONO"). Thereafter, a second polysilicon layer is deposited on the dielectric layer 210 to form a control gate 220 so as to provide a flash memory according to the subject invention.

Figure 10:
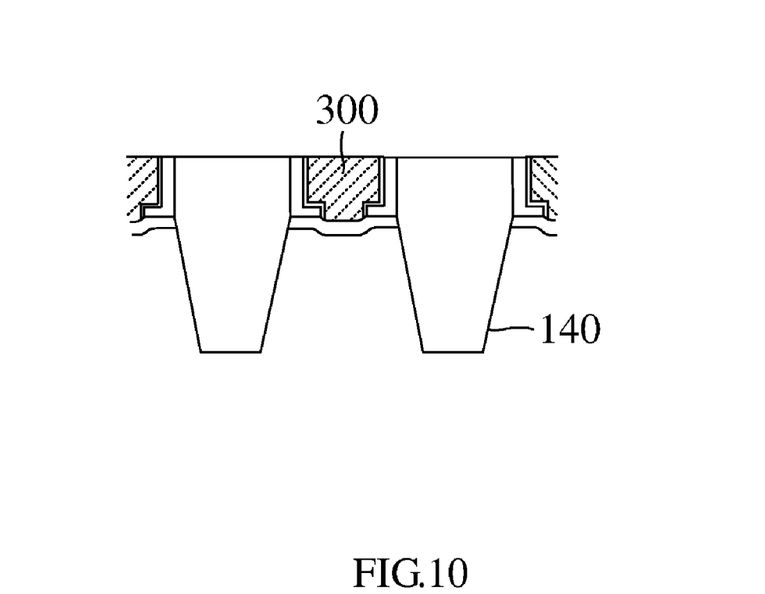
FIGS. 10 to 12 show another embodiment of the steps subsequent to those depicted in FIG. 8, the embodiment comprises the formation of a floating gate by a chemical mechanical polishing process, and the formation of a dielectric layer and a control gate.
Figure 11:
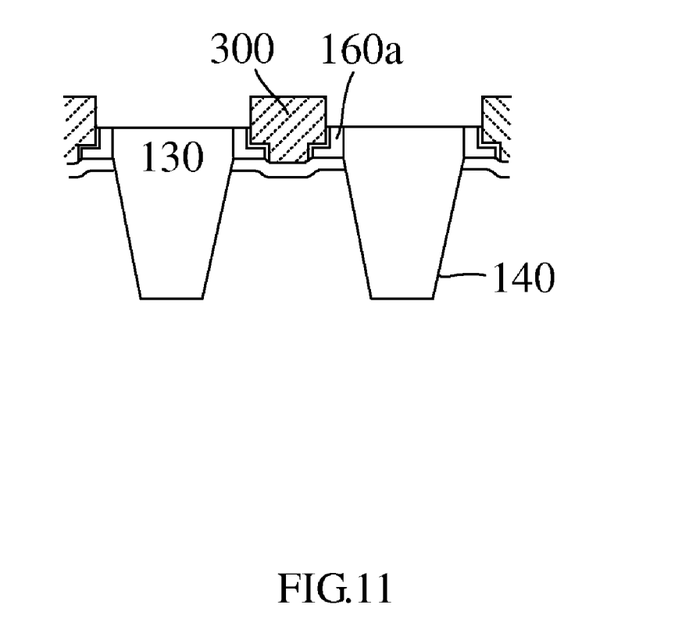
Figure 12:
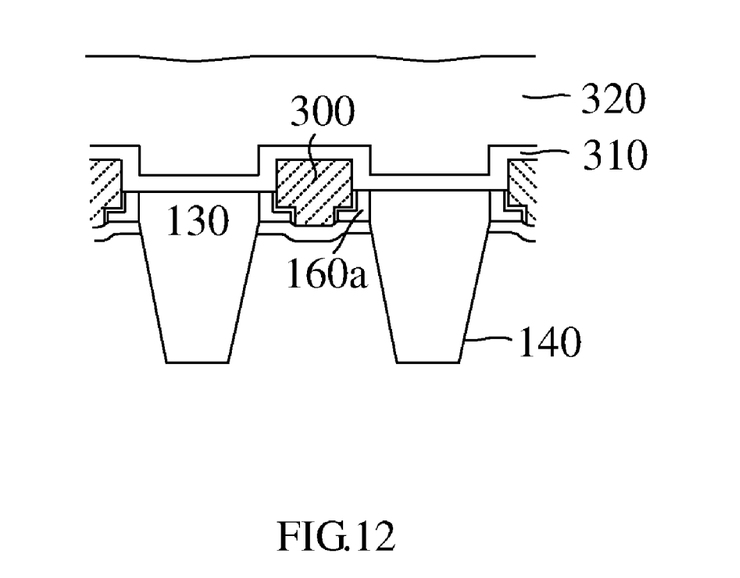

The flash memory provided by the above-mentioned process is one embodiment of the subject invention. Various floating gates may be adopted to meet different requirements. For example, the following combination may be adopted to avoid alignment error that may be encountered in defining a floating gate. Referring to FIG. 10, after the deposition of the first polysilicon layer, a process such as a chemical mechanical polishing process is used to remove a portion from the first polysilicon layer until the upper surface of the shallow trench isolation structure 140 is exposed to form a floating gate 300. Then, as shown in FIG. 11, the insulating layer (high density plasma oxide layer) in the shallow trench isolation structure 140 is etched back to a predetermined depth by using an isotropic or anisotropic etching process. The predetermined depth should not be overly deep, as to keep the level of the remained insulating layer in the shallow trench isolation structure 140 higher than the lower portion of the L-shape second insulating spacer 160a. Then, the portion of the L-shape second insulating spacer 160a exposed on the sidewall of the floating gate 300 is removed to form a cornered L-shape second insulating spacer 160a. Afterwards, the subsequent processes are substantially the same as those described in reference to FIG. 7. Particularly, as depicted in FIG. 12, a dielectric layer 310, made of silicon dioxide, silicon nitride, a material with a high dielectric constant, or a combination thereof, is formed on the floating gate 300. Preferably, the dielectric layer 310 has an ONO structure. A second polysilicon layer is then deposited onto the dielectric layer 310 to form a control gate 320. In comparison with the aforementioned embodiment, this embodiment can be accomplished with one less mask, and also avoid alignment error due to the self-alignment property of the floating gate 300.

Figure 13:
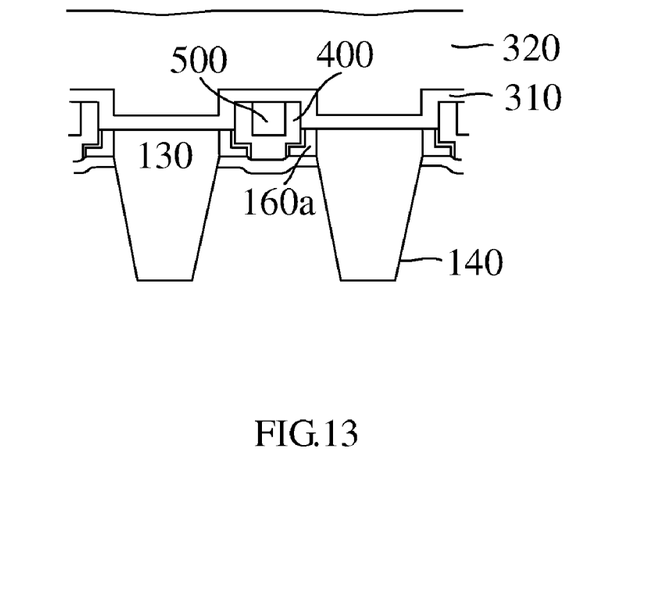
FIG. 13 shows another embodiment of the steps subsequent to those depicted in FIG. 8, the embodiment comprises the formation of a floating gate composed of a multilayered polysilicon.

In another embodiment, a floating gate composed of a multilayered polysilicon can be employed. Specifically, as shown in FIG. 13, a thin polysilicon layer 400 is deposited and then implanted with ions, followed by depositing a polysilicon layer 500 to substantially fill the region between the shallow trench isolation structures 140. Afterwards, a thermal treatment, such as annealing, is conducted to produce a floating gate composed of a multilayered polysilicon.

According to the above method, a semiconductor device with an L-shape spacer is provided. The semiconductor device comprises a substrate, a shallow trench isolation structure, an active area, a composite spacer, and a tunnel insulating layer. Using FIG. 9 as an example, the substrate comprises a shallow trench isolation structure 140 and a neighboring active area 150. A composite spacer composed of a first insulating spacer 110a and an L-shape second insulating spacer 160a is formed on the sidewall of the shallow trench isolation structure 140. The first insulating spacer 110a is located between the L-shape second insulating spacer 160a and the substrate 100. The tunnel insulating layer 180 is located on the substrate portion of the active area 150 and connects to the first insulating spacer 110a on its corresponding side.

The above-mentioned semiconductor device can further comprise a floating gate 200, a dielectric layer 210, and a control gate 220. The floating gate 200 can be a polysilicon layer that covers both the L-shape second insulating spacer 160a and the tunnel insulating layer 180 located in the active area 150. The dielectric layer 210 covers the floating gate 200 and the upper surface of the shallow trench isolation structure 140 between the floating gates 200. The control gate 220 covers the dielectric layer 210. The material of the dielectric layer 210 can be silicon dioxide, silicon nitride, a material with a high dielectric constant, or a combination thereof. Preferably, the dielectric layer 210 is a composite dielectric layer with an ONO structure. The control gate 220 can be a polysilicon layer.

Figure 14:
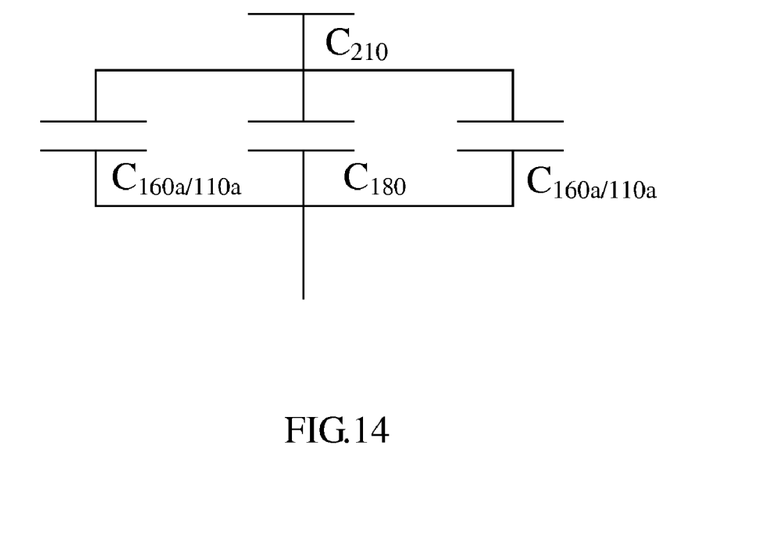
FIG. 14 shows an equivalent circuit of one embodiment of the semiconductor device according to the subject invention.

In the subject invention as shown in FIG. 9, the corner thinning effect of the tunnel oxide layer can be effectively prevented because of the presence of the first insulating spacer 110a in the corner of the active area. FIG. 14 shows an equivalent circuit formed by the composite spacer (including the L-shape second insulating spacer 160a and the first insulating spacer 110a), the tunnel insulating layer 180, the floating gate 200, the dielectric layer 210, and the control gate 220 of the semiconductor device disclosed in the subject invention. The coupling ratio ("CR") of said equivalent circuit can be calculated from the following equation (I):

$$CR = C_{210}/(C_{210} + 2*C_{160a/110a} + C_{180}) \quad (I)$$

wherein $C_{210}$: the capacitance formed by the control gate 220, the dielectric layer 210, and the floating gate 200.

$C_{160a/110a}$: the capacitance formed by the floating gate 200, the composite spacer that is composed of the L-shape second insulating spacer 160a and the first insulating spacer 110a, and the substrate 100.

$C_{180}$: the capacitance formed by the floating gate 200, the tunnel insulating layer 180, and the substrate 100.

Because the first insulating layer at the corner of the active area of the subject invention is thicker than that of conventional devices, $C_{160a/110a}$ is effectively reduced, i.e., the denominator of the coupling ratio ("CR") is reduced. Such reduction substantially raises the coupling ratio, and thus, improves the performance of the semiconductor device, especially the write/read speed and reliability of the flash memory.

Moreover, in the method of the subject invention, the thickness of the L-shape second insulating spacer and that of the first insulating spacer can be controlled, unaffected by the variation of the height or thickness of the insulating layer in the shallow trench isolation area. The thickness is also unaffected by the etching-back conditions as evident in conventional semiconductor devices. Hence, the subject invention can effectively control the coupling ratio. Moreover, the total thickness of the first insulating spacer and the L-shape spacer is thinner than that of the insulating spacer of conventional semiconductor devices, and thus, is sufficient enough to allow F-N tunneling. Consequently, the tunnel area under the floating gate is not substantially reduced.

Given the above, the semiconductor device with an L-shape spacer of the subject invention and its manufacturing method can increase and stably control the coupling ratio without reducing the tunnel area under the floating gate, and thus, improve the write/read speed and reliability.

Although the above disclosure is provided, it is related to the preferred embodiments of the subject invention and not intended to limit the subject invention. People skilled in this field may proceed with changes and modifications without departing from the spirit and scope of the subject invention. Therefore, the scope of protection of the subject invention is based on the following claims as appended.

What is claimed is:

1. A method for manufacturing a semiconductor device with an L-shape spacer, comprising:
   forming a shallow trench isolation structure and an active area onto a substrate, wherein the active area is covered by a first insulating layer;
   forming a second insulating layer, covering both the first insulating layer and the shallow trench isolation structure;
   forming a third insulating layer on the second insulating layer;
   removing a portion from both the second insulating layer and the third insulating layer, to form an L-shape second insulating spacer and a third insulating spacer on a sidewall of the shallow trench isolation structure; and
   removing the third insulating spacer to leave the L-shape second insulating spacer on the first insulating layer.

2. The method of claim 1, wherein the first insulating layer is a silicon dioxide layer.

3. The method of claim 1, wherein the second insulating layer is a silicon nitride layer.

4. The method of claim 1, wherein the third insulating layer is a silicon dioxide layer.

5. The method of claim 1, wherein the step of forming a shallow trench isolation structure comprises conducting an anisotropic or isotropic etching process to etch the substrate.

6. The method of claim 1, wherein the step of removing a portion from both the second insulating layer and the third insulating layer is conducted by an etching-back process.

7. The method of claim 6, wherein the step of etching-back further comprises:
   removing a portion from the third insulating layer by an anisotropic etching process to form the third insulating spacer; and
   removing a portion from the second insulating layer on the substrate by an isotropic or anisotropic etching process to form the L-shape second insulating spacer.

8. The method of claim 1, wherein the step of removing the third insulating spacer is conducted by a wet etching process.

9. The method of claim 8, wherein the wet etching process comprises removing the third insulating spacer and a portion from the first insulating layer on the substrate and leaving a portion of the first insulating layer under the L-shape second insulating spacer to form a first insulating spacer.

10. The method of claim 9, wherein after the step of forming the L-shape second insulating spacer, the method further comprises forming a tunnel insulating layer in the active area by thermal oxidation, wherein the tunnel insulating layer connects to the first insulating layer spacer on its corresponding side.

11. The method of claim 10, wherein after the step of forming the tunnel insulating layer, the method further comprises a step of depositing a polysilicon layer to form a floating gate.

12. The method of claim 11, wherein the step of forming the floating gate further comprises patterning the deposited polysilicon layer.

13. The method of claim 11, wherein the step of forming the floating gate comprises a step of removing a portion from the patterned polysilicon layer by a chemical mechanical polishing process until the upper surface of the shallow trench isolation structure is exposed.

14. The method of claim 11, wherein the polysilicon layer is a multilayered structure.

15. The method of claim 14, wherein after the step of forming the tunnel insulating layer, the method further comprises a step of depositing a thin polysilicon layer and then implanting ions into the thin polysilicon layer, followed by forming another polysilicon layer and conducting a thermal treatment so as to form the multilayered polysilicon.

16. The method of claim 11, wherein after the step of forming the floating gate, the method further comprises a step of forming a dielectric layer.

17. The method of claim 16, wherein the material of the dielectric layer is silicon dioxide, silicon nitride, a material with a high dielectric constant, or a combination thereof.

18. The method of claim 16, wherein after the step of forming the dielectric layer, the method further comprises a step of depositing a second polysilicon layer to form a control gate.

* * * * *